United States Patent
Baek et al.

(10) Patent No.: US 12,392,944 B2
(45) Date of Patent: Aug. 19, 2025

(54) PHOTOLUMINESCENCE DEVICE AND DISPLAY PANEL INCLUDING THE SAME

(71) Applicant: SAMSUNG DISPLAY CO., LTD., Yongin-si (KR)

(72) Inventors: Moonjung Baek, Seoul (KR); Seon-Tae Yoon, Seoul (KR); Junghyun Kwon, Seoul (KR); Youngmin Kim, Asan-si (KR); Haeil Park, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/752,265

(22) Filed: Jun. 24, 2024

(65) Prior Publication Data

US 2024/0345298 A1    Oct. 17, 2024

Related U.S. Application Data

(63) Continuation of application No. 18/091,316, filed on Dec. 29, 2022, now Pat. No. 12,044,870, which is a (Continued)

(30) Foreign Application Priority Data

Dec. 5, 2016  (KR) .......................... 10-2016-0164548

(51) Int. Cl.
  *G02B 5/20*   (2006.01)
  *G02B 5/28*   (2006.01)
  (Continued)

(52) U.S. Cl.
  CPC ............. *G02B 5/201* (2013.01); *G02B 5/285* (2013.01); *G02F 1/133512* (2013.01);
  (Continued)

(58) Field of Classification Search
  CPC . G02B 5/201; G02B 6/0026; G02F 1/133617; G02F 1/133514;
  (Continued)

(56) References Cited

U.S. PATENT DOCUMENTS 7,750,984 B2   7/2010  Ha et al.
9,239,458 B2   1/2016  Yoon et al.
(Continued)

FOREIGN PATENT DOCUMENTS

CN   102289069   12/2011
CN   103228983    7/2013
(Continued)

OTHER PUBLICATIONS

Chinese Office Action dated Aug. 18, 2021, in Chinese Patent Application No. 201711265856.1 (with English translation).
(Continued)

*Primary Examiner* — Ephrem Z Mebrahtu
(74) *Attorney, Agent, or Firm* — CANTOR COLBURN LLP

(57) ABSTRACT

A display panel includes: a light emitting device to generate light; a plurality of color conversion patterns including: a first color conversion pattern including first scattering particles dispersed in the first color conversion pattern and configured to scatter the light of the light emitting device; and a second color conversion pattern including second scattering particles dispersed in the second color conversion pattern and configured to scatter the light of the light emitting device; a plurality of color filters including: a first color filter overlapping the first color conversion pattern; and a second color filter overlapping the second color conversion pattern; and a single, low index of refraction layer continuously extending in the surface direction to overlap the first and the second color conversion patterns.

(Continued)

The low index of refraction layer has a refractive index lower than refractive indexes of the first and second color conversion patterns.

22 Claims, 14 Drawing Sheets

Related U.S. Application Data continuation of application No. 16/985,153, filed on Aug. 4, 2020, now Pat. No. 11,567,248, which is a continuation of application No. 15/627,451, filed on Jun. 20, 2017, now Pat. No. 10,739,502.

(51) Int. Cl.
| | | |
|---|---|---|
| *G02F 1/1335* | (2006.01) | |
| *G02F 1/13357* | (2006.01) | |
| *H10K 50/858* | (2023.01) | |
| *H10K 59/38* | (2023.01) | |
| *H10K 59/80* | (2023.01) | |

(52) U.S. Cl.
CPC .. *G02F 1/133514* (2013.01); *G02F 1/133617* (2013.01); *H10K 50/858* (2023.02); *H10K 59/38* (2023.02); *H10K 59/879* (2023.02); *G02F 1/133521* (2021.01); *G02F 2201/44* (2013.01)

(58) Field of Classification Search
CPC ......... G02F 1/133621; G02F 1/133512; G02F 2001/133614; G02F 2001/133521; G02F 2201/44; G02F 2001/136222
See application file for complete search history.

(56) References Cited

U.S. PATENT DOCUMENTS

| | | |
|---|---|---|
| 9,773,955 B2 | 9/2017 | Jeon et al. |
| 10,302,845 B2 | 5/2019 | Dubrow et al. |
| 2007/0228927 A1 | 10/2007 | Kindler et al. |
| 2011/0248256 A1 | 10/2011 | Cok et al. |
| 2011/0305000 A1 | 12/2011 | Bukesov et al. |
| 2012/0250351 A1 | 10/2012 | Shin et al. |
| 2013/0335799 A1 | 12/2013 | Yoon et al. |
| 2014/0192294 A1 | 7/2014 | Chen et al. |
| 2014/0321101 A1 | 10/2014 | Kadowaki |
| 2015/0131029 A1 | 5/2015 | Kaida et al. |
| 2015/0168623 A1 | 6/2015 | Beon et al. |
| 2015/0171372 A1 | 6/2015 | Iwata et al. |
| 2015/0228232 A1 | 8/2015 | Lee et al. |
| 2016/0041430 A1 | 2/2016 | Lee et al. |
| 2016/0266695 A1 | 9/2016 | Bae et al. |
| 2018/0284613 A1 | 10/2018 | Hirayama et al. |

FOREIGN PATENT DOCUMENTS

| | | | |
|---|---|---|---|
| CN | 204375791 U | 6/2015 | |
| CN | 106094328 | 11/2016 | |
| JP | 07-325202 | 12/1995 | |
| JP | 2009128742 | 6/2009 | |
| KR | 20080020312 | 3/2008 | |
| KR | 10-2013-0000506 | 1/2013 | |
| KR | 10-2013-0140462 | 12/2013 | |
| KR | 10-2015-0077764 | 7/2015 | |
| KR | 10-2016-0017373 | 2/2016 | |
| KR | 20180063188 | 6/2018 | |
| WO | 2012161012 | 11/2012 | |
| WO | WO-2012161012 A1 * | 11/2012 | ............. G02B 5/201 |
| WO | 2013080947 | 6/2013 | |

OTHER PUBLICATIONS

Chinese Office Action dated Mar. 11, 2022, in Chinese Patent Application No. 201711265856.1 (with English translation).
European Extended Search Report dated Dec. 2, 2021, in European Patent Application No. 21188392.1.
Extended European Search Report dated May 28, 2018, issued in European Patent Application No. 17205281.3-1020.
A Non-Final Office Action dated May 10, 2019, in U.S. Appl. No. 15/627,451.
A Final Office Action dated Nov. 18, 2019, in U.S. Appl. No. 15/627,451.
A Notice of Allowance dated Apr. 1, 2020, in U.S. Appl. No. 15/627,451.
A Non-Final Office action dated Oct. 6, 2021, issued to U.S. Appl. No. 16/985,153.
A Final Office action dated Jul. 7, 2022, issued to U.S. Appl. No. 16/985,153.
A Notice of Allowance dated Oct. 20, 2022, issued to U.S. Appl. No. 16/985,153.

* cited by examiner

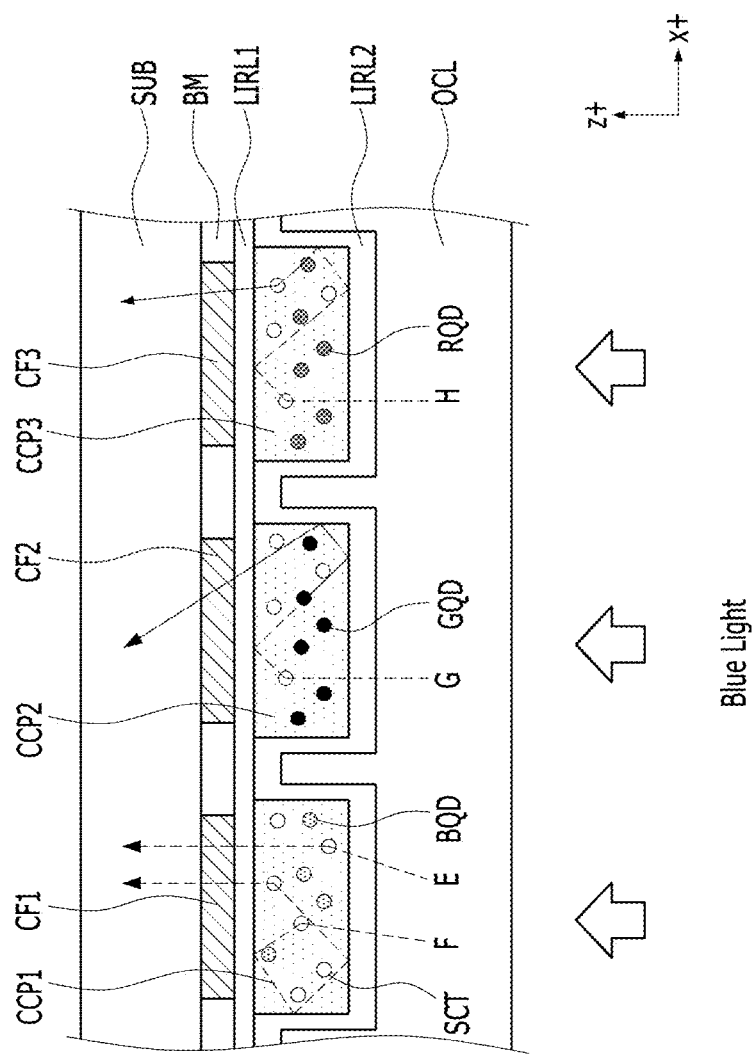

PHOTOLUMINESCENCE DEVICE AND DISPLAY PANEL INCLUDING THE SAME

CROSS-REFERENCE TO RELATED APPLICATIONS

This application is a Continuation of U.S. patent application Ser. No. 18/091,316, filed on Dec. 29, 2022, which is a Continuation of U.S. patent application Ser. No. 16/985,153, filed on Aug. 4, 2020, which is a Continuation of U.S. patent application Ser. No. 15/627,451, filed on Jun. 20, 2017, and claims priority from and the benefit of Korean Patent Application No. 10-2016-0164548, filed on Dec. 5, 2016, which is hereby incorporated by reference for all purposes as if fully set forth herein.

BACKGROUND

Field

The invention relates generally to a photoluminescence device and a display panel including the same, and more particularly to a photoluminescence device capable of reducing attenuation of the emitted light and having improved brightness and/or luminous efficiency.

Discussion of the Background

Various display panels are used for a wide variety of multimedia devices such as televisions, mobile phones, tablet computers, navigations, and game consoles. These display panels require more and more sophisticated display panels capable of displaying accurate and realistic color images.

A display panel includes an element such as an array of LEDs or OLEDs that emits light so as to generate an image. The display panel further includes a photoluminescence device receiving the emitted light. The photoluminescence device includes a color filter or a color conversion structure to display desired colors using the emitted light according to control and driving signals for display desired images. The color conversion structure such as a quantum dots pattern converts a wavelength of light entering the color conversion structure into a desired color light so that a desired color is displayed. The color filter passes the desired color light and absorbs the other color lights so that a desired color is displayed.

In order for the display panel to display more realistic, color images at greater efficiency, there is a need for the photoluminescence device to decrease attenuation of the emitted light and to have improved luminous efficiency.

The above information disclosed in this Background section is only for enhancement of understanding of the background of the inventive concept, and, therefore, it may contain information that does not form the prior art that is already known to a person of ordinary skill in the art.

SUMMARY

Exemplary embodiments of the invention satisfy one of more of the foregoing needs and/or overcome one of more of the drawbacks of conventional devices by providing a photoluminescence device having decreased attenuation of emitted light and improved luminous efficiencies. According to the principles of the invention, a low index of refraction layer may be disposed between a color conversion pattern and a color filter and may have a refractive index lower than the refractive index of the color conversion pattern.

Additional aspects will be set forth in the detailed description which follows, and, in part, will be apparent from the disclosure, or may be learned by practice of the inventive concept.

According to one aspect of the invention, a photoluminescence device for an image generating device includes a color conversion pattern having a first refractive index and configured to convert light provided from the image generating device from one wavelength to another; a color filter configured to selectively pass light of a given range of wavelengths transmitted through the color conversion pattern; and a low index of refraction layer having a second refractive index and being disposed between the color conversion pattern and the color filter. The second refractive index being lower than the first refractive index.

The color filter may have a third refractive index, and the second refractive index is lower than both of the first refractive index and the third refractive index.

The low index of refraction layer may be a single layer including transparent resin and microcavities.

The second refractive index may be about 1.4 or less.

The color filter may have a third refractive index, the first refractive index may be in a range of about 1.58 to about 1.62, the second refractive index may be about 1.2, and the third refractive index may be in a range of about 1.49 to about 1.66.

The low index of refraction layer may be disposed directly on the color conversion pattern.

The photoluminescence device may further include a light reflection layer disposed between the color conversion pattern and the image generating device and configured to selectively reflect light of a particular range of wavelengths.

The color conversion pattern may receive a first light from the image generating device through the light reflection layer and convert the first light into a second light. The first light may have a first wavelength and the second light may have a second wavelength longer than the first wavelength. The light reflection layer may be configured to pass the first light and reflect the second light.

The light reflection layer may cover the color conversion pattern.

The photoluminescence device may further include a second low index of refraction layer having a third refractive index and disposed between the color conversion pattern and the light reflection layer. The third refractive index may be lower than the first refractive index.

The photoluminescence device may further include a second low index of refraction layer having a third refractive index and disposed between the light reflection layer and the image generating device. The third refractive index may be lower than the first refractive index.

The photoluminescence device may further include a second low index of refraction layer having a third refractive index lower than the first refractive index. The low index of refraction layer and the second low index of refraction may surround the color conversion pattern.

The photoluminescence device may further include a substrate and sub-black matrices each extending in a direction of a surface of the substrate. The color filter, the low index of refraction layer, and the color conversion pattern may be stacked on the substrate, and the sub-black matrices may be disposed in an area in which the color filter is disposed.

Each of the sub-black matrices may include a reflective metal pattern facing the low index of refraction layer.

According to another aspect of the invention, a photoluminescence device for an image generating device includes a substrate, a plurality of patterns each having a first refractive index and arranged in a direction of a surface of the substrate, each of the plurality of patterns being configured to convert or scatter light transmitted from the image generating device, color filters arranged in the direction of the surface of the substrate on the substrate, each of the color filters being configured to selectively pass light of a given range of wavelengths, and a low index of refraction layer having a second refractive index and disposed between the plurality of patterns and the color filters. The second refractive index being lower than the first refractive indexes.

The color filters may have third refractive indexes, and the second refractive index may be lower than the third refractive indexes.

The first refractive indexes may be different from each other.

The plurality of patterns may include a first pattern configured to convert the light transmitted from the image generating device and a second pattern configured to scatter the light transmitted from the image generating device. The color filters may include a first color filter corresponding to the first pattern. The first color filter may be configured to selectively pass light of a first range of wavelengths.

The color filters may further include a second color filter corresponding to the second pattern. The second color filter may be configured to selectively pass light of a second range of wavelengths different from the first range of wavelengths.

The photoluminescence device of claim 15 may further include a light reflection layer disposed between the plurality of patterns and the image generating device and configured to selectively reflect light of a particular range of wavelengths.

The plurality of patterns may receive a first light having a first wavelength from the image generating device through the light reflection layer, at least one of the plurality of patterns may convert one of the first lights into a second light having a second wavelength longer than the first wavelength, and the light reflection layer may be configured to pass the first light and reflect the second light.

According to one aspect of the invention, a display panel includes an image generating device configured to emit light based on an input image signal, and a photoluminescence device configured to receive emitted light from the image generating device. The photoluminescence device includes a color conversion pattern having a first refractive index and configured to convert the emitted light from one wavelength to another wavelength, a color filter configured to selectively pass light of a given range of wavelengths transmitted through the color conversion pattern, and a low index of refraction layer having a second refractive index lower than the first refractive index and being disposed between the color conversion pattern and the color filter.

According to one aspect of the invention, an exemplary method of controlling photoluminescence of light generated by a display device includes the steps of receiving a first light from an image generating device, converting the first light from one wavelength to another wavelength using a color conversion pattern, reflecting a second light passing through the color conversion pattern according to an angle of incidence of the second light, and re-converting the reflected second light using the color conversion pattern.

The method may further include the step of reflecting the re-converted second light to transmit through the color conversion pattern when a wavelength of the re-converted second light is in a particular range of wavelengths.

The method may further include the step of reflecting the re-converted second light to transmit through the color conversion pattern according to an angle of incidence of the re-converted second light.

The step of reflecting of the second light may includes reflecting the second light when the angle of incidence of the second light is equal to or greater than a threshold angle, and transmitting the second light through a color filter when the angle of incidence of the second light is less than the threshold angle.

The method may further include the step of filtering a third light passing through the color conversion pattern using a color filter. The third light may be at least one of the transmitted second light and the re-converted second light.

According to still another aspect of the invention, a display panel includes: a light emitting device to generate light; a plurality of color conversion patterns spaced apart from each other and arranged in a surface direction of the display panel, the plurality of color conversion patterns including: a first color conversion pattern to convert the light of the light emitting device to have a first wavelength, the first color conversion pattern including first scattering particles dispersed in the first color conversion pattern and configured to scatter the light of the light emitting device without converting the light of the light emitting device; and a second color conversion pattern to convert the light of the light emitting device to have a second wavelength, the second color conversion pattern including second scattering particles dispersed in the second color conversion pattern and configured to scatter the light of the light emitting device without converting the light of the light emitting device; a plurality of color filters disposed on the plurality of color conversion patterns, the plurality of color filters arranged in the surface direction and including: a first color filter overlapping the first color conversion pattern and configured to selectively pass light of a first range of wavelengths transmitted through the first color conversion pattern; and a second color filter overlapping the second color conversion pattern and configured to selectively pass light of a second range of wavelengths transmitted through the second color conversion pattern; and a single, low index of refraction layer disposed between the first color conversion pattern and the first color filter and between the second color conversion pattern and the second color filter, the low index of refraction layer continuously extending in the surface direction to overlap the first and the second color conversion patterns. The low index of refraction layer has a refractive index lower than refractive indexes of the first and second color conversion patterns.

The first color conversion pattern may include first quantum dots to convert the light of the light emitting device to have the first wavelength, and the second color conversion pattern may include second quantum dots to convert the light of the light emitting device to have the second wavelength, the second wavelength being different from the first wavelength.

The first range and the second range may be different from each other.

The refractive index of the low index of refraction layer may be lower than a refractive index of the color filter.

The display device may further include a light reflection layer disposed between the plurality of color conversion patterns and the light emitting device and configured to selectively reflect light of a particular range of wavelengths.

The light reflection layer may cover the plurality of color conversion patterns.

The low index of refraction layer may include transparent resin and microcavities.

The display device may further include a second low index of refraction layer having a refractive index lower than the refractive indexes of the first and second color conversion patterns. The first and second color conversion patterns may be disposed between the single low index of refraction layer and the second low index of refraction layer.

According to the exemplary embodiments, a photoluminescence device having decreases attenuation of light and greater luminous efficiency may be provided. For example, since the color conversion structure according to exemplary embodiments of the invention converts a higher percentage of the emitted light into the desired color light, the amount of the desired color light transmitted through the color filter increases and the amount of the other color light absorbed by the color filter decrease. This results in a photoluminescence device that outputs the emitted light as the desired color light with improved efficiency The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 7 is a cross-sectional view of an exemplary embodiment of a photoluminescence device of the invention.

DETAILED DESCRIPTION OF THE ILLUSTRATED EMBODIMENTS

Figure 1:
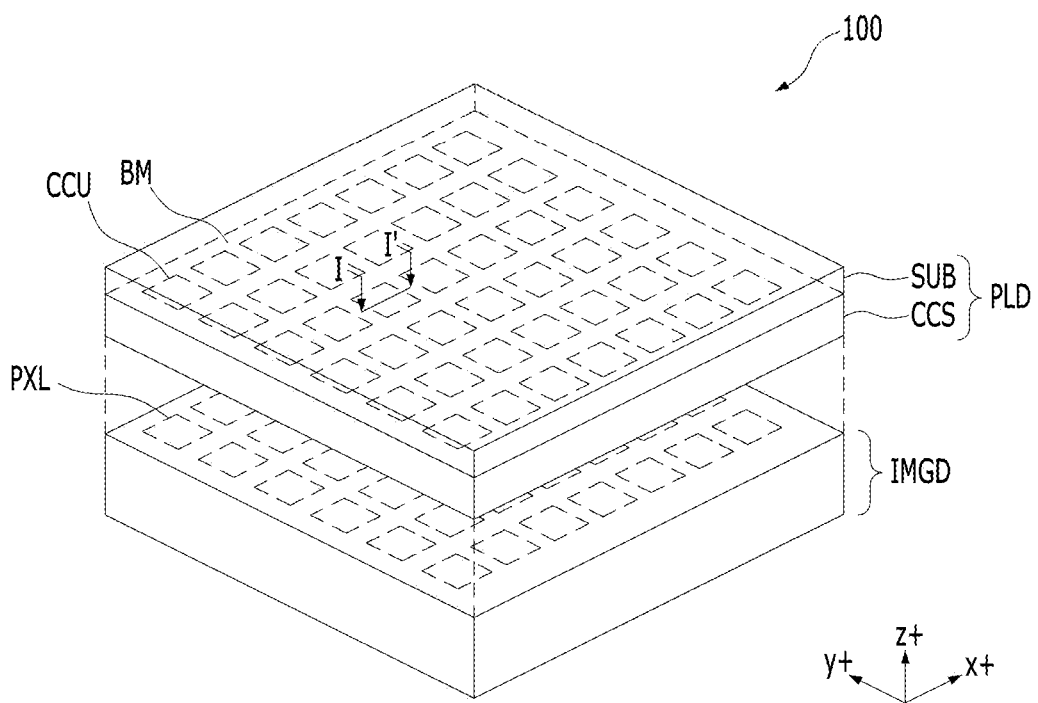
FIG. 1 is a perspective view illustrating an exemplary embodiment of a display panel 100 constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view illustrating an exemplary embodiment of a display panel 100 constructed according to the principles of the invention.

Referring to FIG. 1, the display panel 100 includes an image generating device IMGD and a photoluminescence device PLD. As discussed in more detail herein, the image generating device IMGD may be any number of devices known in the art to emit light having an intensity associated with the grayscale of light emitted by each of pixels PXL based on an input image signal. The light emitted by the image generating device IMGD is transmitted to the photoluminescence device PLD. The image generating device IMGD includes a plurality of pixels PXL arranged in a first direction x and a second direction y which intersects the first direction x. The image generating device IMGD may further include a peripheral circuit such as a driving circuit which operates the plurality of pixels PXL to control the emitted light in accordance with known principles in the art.

The light emitted by the image generating device IMGD has one of various wavelengths such as ultraviolet rays, near-ultraviolet rays, and visible light. For example, the image generating device IMGD controls the intensity of the emitted light based on the input image signal from an external device.

The photoluminescence device PLD is disposed on or over the image generating device IMGD and receives the light emitted by the image generating device IMGD. The photoluminescence device PLD includes a substrate SUB and a color conversion structure CCS disposed on the substrate SUB.

The color conversion structure CCS receives the light emitted by the image generating device IMGD, and is configured to convert the emitted light from one wavelength to another wavelength. The color conversion structure CCS includes color conversion units CCU and a black matrix BM.

The color conversion units CCU are arranged in the first direction x and the second direction y. The color conversion units CCU are aligned to receive the light emanating from the pixels PXL of the image generating device IMGD and may by positioned in a one-to-one ratio with the pixels or in a one-to-more than one ratio, i.e, the CCUs may receive light from a single pixel or multiple pixel. In FIG. 1, the color conversion units CCU correspond to the pixels PXL of the image generating device IMGD in a one-to-one ratio. Each of the color conversion units CCU may convert light transmitted from a corresponding pixel of the image generating device IMGD from one wavelength to another wavelength, through any means known in the art, such a quantum dots.

A black matrix BM is disposed between the color conversion units CCU. The black matrix BM is configured to prevent light transmitted through the color conversion units CCU from being inter-mixed with each other.

Figure 2:
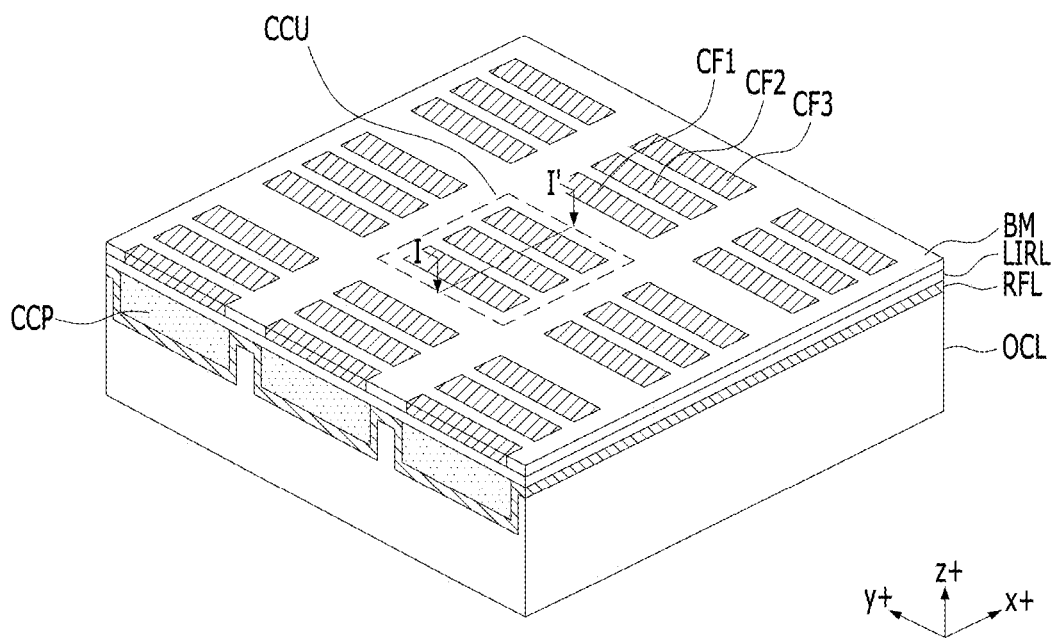
FIG. 2 is a perspective view illustrating a portion of the color conversion structure shown in FIG. 1 according to an exemplary embodiment of the invention.

FIG. 2 is a perspective view illustrating a portion of the color conversion structure CCS shown in FIG. 1 according to an exemplary embodiment of the invention.

Referring to FIG. 2, the color conversion structure CCS includes an overcoat layer OCL, a light reflection layer RFL, color conversion patterns CCP, a low index of refraction layer LIRL, a black matrix BM, and color filters CF1, CF2, and CF3.

The overcoat layer OCL is provided at the bottom of the structure illustrated in FIG. 2. The overcoat layer OCL protects the light reflection layer RFL, the color conversion patterns CCP, the low index of refraction layer LIRL, the black matrix BM, and the color filters CF1, CF2, and CF3 from damage, and improves the flatness of a bottom surface of the color conversion structure CCS. The overcoat layer OCL may be made of at least one of an organic material and an inorganic material.

The light reflection layer RFL is disposed on the overcoat layer OCL. The light reflection layer RFL may cover at least a portion of surfaces of the color conversion patterns CCP. The light reflection layer RFL may contact the low index of refraction layer LIRL disposed above the RFL. The light reflection layer RFL is configured to selectively reflect light of a particular range of wavelengths. For example, the light reflection layer may be configured to pass light of a first wavelength transmitted from the image generating device IMGD shown in FIG. 1, and reflect a light having a range of wavelengths lower than the first wavelength. For instance, the light reflection layer may pass near-ultraviolet rays and reflect light having other ranges of wavelengths such as visible light when the image generating device IMGD emits near-ultraviolet rays. The light reflection layer may pass blue light and reflect light having the other rages of wavelengths such as visible light excluding blue light when the image generating device IMGD emits the blue light.

In an exemplary embodiment, the light reflection layer may include multiple layers such as a thin layer having a low index of refraction and a thin layer having a high-refraction index, which are alternately arranged to form a half-mirror that may reflect light at a particular range of wavelengths. The reflected light may be selected by adjusting a thickness of each thin layer.

The color conversion patterns CCP are disposed between the light reflection layer RFL and the low index of refraction layer LIRL, as evident from the left or front side of FIG. 2. Each of the color conversion patterns CCP may be configured to convert the light transmitted from a corresponding pixel from one wavelength to another. For instance, each of the color conversion patterns CCP may absorb a first light transmitted from a corresponding pixel of the image generating device IMGD and emit a second light having a longer wavelength than the first light. The second light may have an energy level lower than the first light.

In an exemplary embodiment, each of the color conversion patterns CCP may include a phosphor and/or quantum dots as a color conversion material that absorbs the first light and emits the second light having a different wavelength, as is known in the art. The phosphor may emit at least one of lights of various colors, such as blue light, green light, or red light, as visible light. The quantum dots may emit at least one of lights of various colors, such as blue light, green light, or red light, as visible light.

Each of the color conversion units CCU may include at least one color conversion pattern. For example, each of the color conversion units CCU may include three color conversion patterns CCP which respectively emits three lights having different wavelengths, such as blue light, green light, and red light. For example, the color conversion pattern for the blue light may be omitted when the light transmitted from the image generating device IMGD is the blue light.

Figure 3:
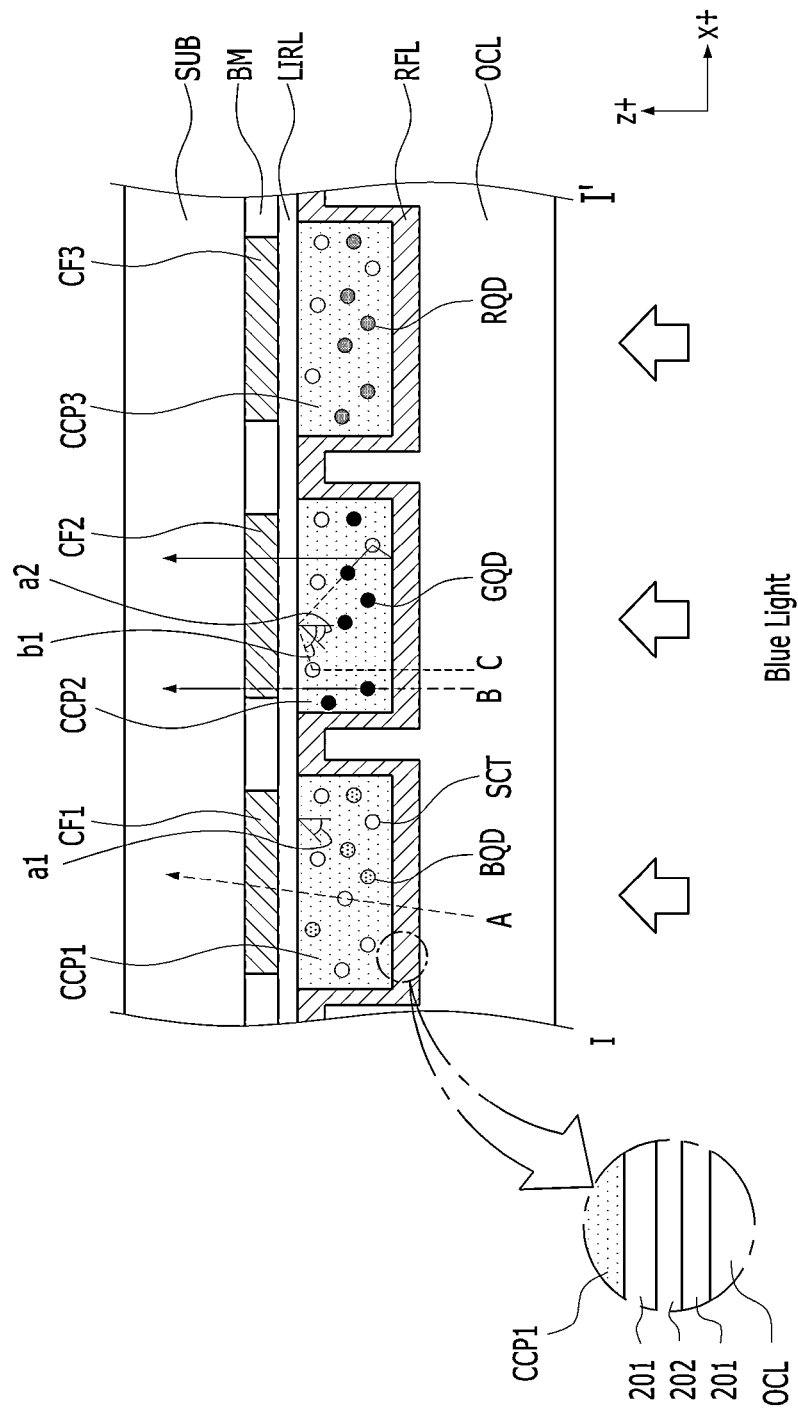
FIG. 3 is a cross-sectional view of an exemplary embodiment of a photoluminescence device taken along line I-I' of FIG. 1.
Figure 4:
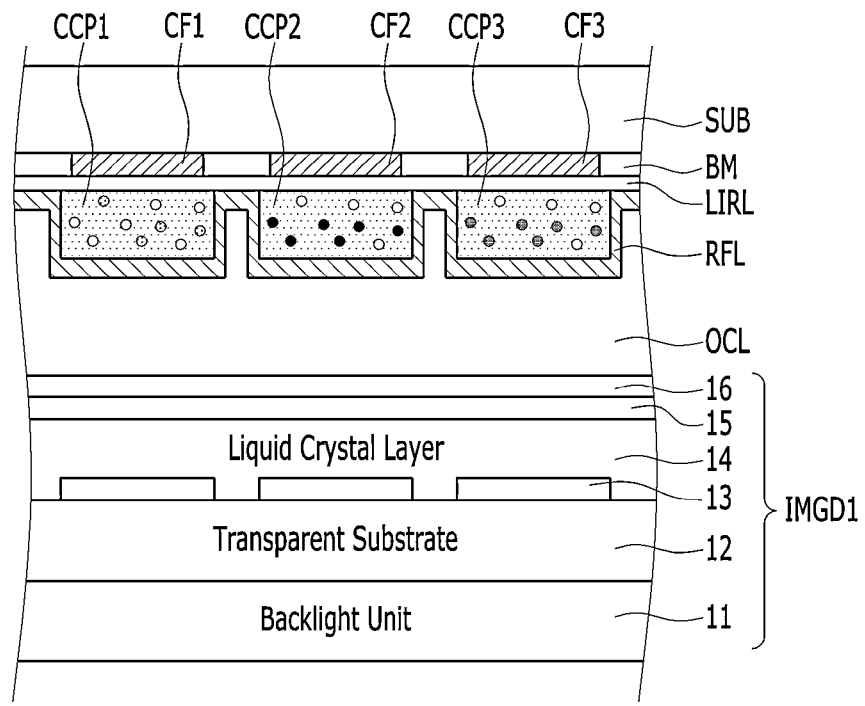
FIG. 4 is a cross-sectional view of an exemplary embodiment of a display panel taken along line I-I' of FIG. 1
Figure 5:
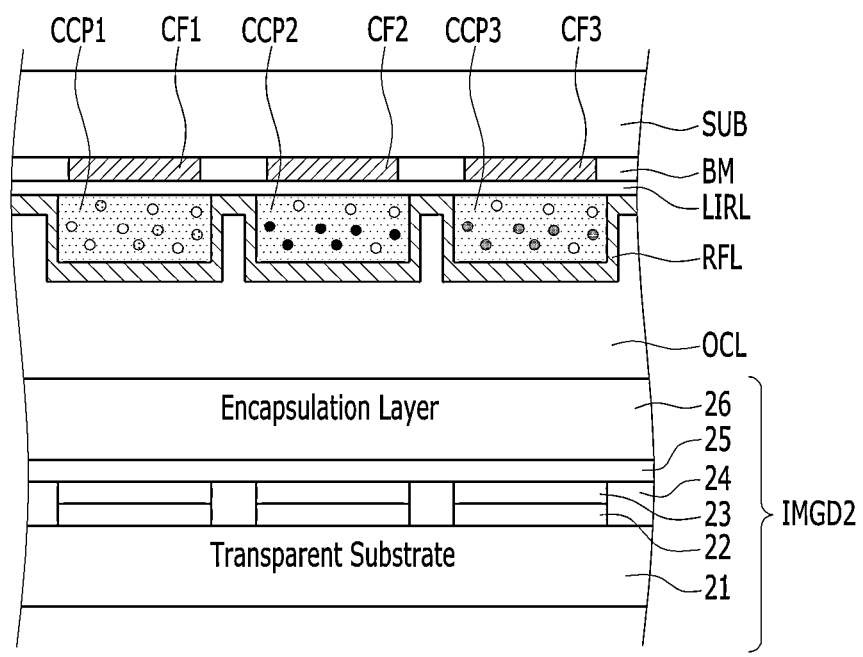
FIG. 5 is a cross-sectional view of another exemplary embodiment of a display panel 100 taken along line I-I' of FIG. 1.

As shown best in FIGS. 3-5, the low index of refraction layer LIRL is disposed between the color conversion patterns CCP and the color filters CF1, CF2, and CF3. The low index of refraction layer LIRL has an index of refractive (n) lower than those of the color conversion patterns CCP. The low index of refraction layer LIRL may be disposed directly on the color conversion patterns CCP.

Total internal reflection for light occurs when the light passing through a material having a high refractive index strikes a material having a low refractive index at an incidence angle greater than a threshold angle. The incidence angle with respect to the surface can be defined as an angle between a direction of the light and a line or direction orthogonal to the surface. The light transmitted from the image generating device IMGD through the color conversion patterns CCP may be reflected according to an incidence angle of the light impinging the low index of refraction layer LIRL. In this case, the incidence angle can be defined as an angle between a direction of the light and a third direction z, the third direction z being orthogonal to a surface of the low index of refraction layer LIRL. The light may be reflected when the incidence angle is equal to or greater than a threshold angle, and may pass through the layer at an angle due to refraction when the incidence angle is less than the threshold angle. For example, the threshold angle may be about 50 degrees. The threshold angle may decrease as the difference between the refractive index of each color conversion pattern and the refractive index of the low index of refraction layer LIRL increases. The probability of reflecting the light may increase as the threshold angle decrease. For example, the threshold angle may be proportional to a value which is calculated by dividing the refractive index of the low index of refraction layer LIRL by the refractive index of a color conversion pattern. The threshold angle may decrease as the refractive index of the low index of refraction layer LIRL decreases. For example, in a case where the refractive index of the color conversion pattern is 1.6, the threshold angle may be 61 degrees when the refractive index of the low index of refraction layer LIRL is 1.4, the threshold angle may be 49 degrees when the refractive index of the low index of refraction layer LIRL is 1.2, and the threshold angle may be 39 degrees when the refractive index of the low refractive index of the low index of refraction layer LIRL is 1.0.

In an exemplary embodiment, the refractive index of the low index of refraction layer LIRL is lower than the color conversion patterns CCP and the color filters CF1, CF2, and CF3. In an exemplary embodiment, the low index of refraction layer LIRL may include transparent resin and microcavities. The refractive index of the low index of refraction layer LIRL may be adjusted by changing a number or a ratio of cavities per unit area.

The black matrix BM is disposed on the low index of refraction layer LIRL. The black matrix BM has openings (See OP in FIG. 6A) that define display areas in each of the color conversion units CCU.

Each of the color conversion units CCU includes at least one color filter disposed in the display areas. In FIG. 2, three color filters CF1, CF2, and CF3 are provided in each color conversion unit. Each of the first to third color filters CF1 to CF3 has one of visible colors such as blue, green, yellow, and red. Each of the first to third color filters CF1 to CF3 is configured to selectively pass light of a given range of wavelengths corresponding to one of visible colors. For example, a blue color filter may pass a blue light having a longer wavelength than ultraviolet rays and absorb the other lights, a green color filter may pass a green light having a longer wavelength than the blue light and absorb the other lights, and a red color filter may pass a red light having a longer wavelength than the green light and absorb the other lights.

The first to third color filters CF1 to CF3 may have different colors each other. Alternatively, at least two of the first to third color filters CF1 to CF3 may have the same color. For instance, each of the first to third color filters CF1 to CF3 is one of a blue color filter, a green color filter, a red color filter, and a yellow color filter. Hereinafter, for descriptive convenience, it is assumed that the first to third color filters CF1 to CF3 are a blue color filter, a green color filter, and a red color filter, respectively.

In an exemplary embodiment, the refractive index of the low index of refraction layer LIRL is about 1.4 or less, and more preferably about 1.2 or less. The refractive index of the low index of refraction layer LIRL may be adjusted in a range of about 1.0 to about 1.4 by changing a number of cavities of the low index of refraction layer LIRL. For instance, the refractive index of the low index of refraction layer LIRL may be about 1.2. In an exemplary embodiment, refractive indexes of the color conversion patterns CCP may be in the range of 1.58 to 1.62. For example, the refractive indexes of the color conversion patterns CCP may be determined depending on what quantum dots each color conversion pattern includes, the number of quantum dots, and the number of scatterers. In an exemplary embodiment, the refractive index of the first color filter CF1 may be about 1.49, the refractive index of the second color filter CF2 may be about 1.57, the refractive index of the third color filter CF3 may be about 1.66, the refractive index of the black matrix BM may be about 1.67. In an exemplary embodiment, the refractive index of the low index of refraction layer LIRL may be lower than those of the color conversion patterns CCP, the first to third color filters CF1 to CF3, and the black matrix BM.

Each component of the color conversion structure CCS may have various thicknesses according to the particular manufacturing method. For instance, the thickness of the light reflection layer RFL may be two (2) micrometers or less, the thickness of each color conversion pattern may be ten (10) micrometers or less, the thickness of the low index of refraction layer LIRL may be two (2) micrometers or less, and the thickness of each color filter may be three (3) micrometers or less.

FIG. 3 is a cross-sectional view of an exemplary embodiment of a photoluminescence device PLD taken along line I-I' of FIG. 1.

Referring to FIG. 3, a color conversion unit includes color conversion patterns CCP1, CCP2, and CCP3 and color filters CF1 to CF3. The color conversion patterns CCP1, CCP2, and CCP3 are disposed between the light reflection layer RFL and the low index of refraction layer LIRL.

The first to third color conversion patterns CCP1 to CCP3 receive light transmitted from the image generating device IMGD through the light reflection layer RFL. The first to third color conversion patterns CCP1 to CCP 3 may convert the received light into first to third color lights, respectively. The first to third color conversion patterns CCP1 to CCP 3 may correspond to the first to third color filters CF1 to CF3, respectively. The first to third color lights may be transmitted to the first to third color filters CF1 to CF3, respectively, when each color light passes through the low index of refraction layer LIRL.

In an exemplary embodiment, the first to third color conversion patterns CCP1 to CCP3 may include scatterers SCT. The scatterers SCT scatter the received light so that the light is uniformly transmitted to a surface of a corresponding color filter.

Hereinafter, for descriptive convenience, it is assumed that the first to third color conversion patterns CCP1 to CCP3 convert the received light into a blue light, a green light, and a red light, respectively. The first color conversion pattern CCP1 may include blue quantum dots BQD emitting the blue light when absorbing the light, the second color conversion pattern CCP2 may include green quantum dots GQD emitting the green light when absorbing the light, and the third color conversion pattern CCP3 may include red quantum dots RQD emitting the red light when absorbing the light.

The light reflection layer RFL may include 2n+1 (where n is a natural number) thin layers which have different refraction indexes. In FIG. 3, the light reflection layer RFL includes first thin layers 201 and a second thin layer 202 which is disposed between the first thin layers 201. A range of wavelengths which the light reflection layer RFL reflects may be adjusted by changing a thickness of each of the first thin layers 201 and the second thin layer 202. The light reflection layer RFL may pass light transmitted from the image generating device IMGD shown in FIG. 1, and reflect light having a range of wavelengths lower than the light transmitted from the image generating device IMGD.

For descriptive convenience, it is assumed that the image generating device IMGD provides a blue light in description with reference to FIG. 3. A light A is transmitted to the first color conversion pattern CCP1. The light A passes the reflection layer RFL and arrives the first color conversion pattern CCP1. The light A may be scattered by the scatterers SCT of the first color conversion pattern CCP1 and the direction of the light A may be changed. The light A may be converted into, for example, a blue light having a slightly lower wavelength than the light A by the blue quantum dots BQD. The light A may be transmitted to the first color filter CF1 when an incidence angle of the light A is less than a threshold angle a1 which is associated with the difference between the refractive index of the first color conversion pattern CCP1 and the refractive index of the low index of refraction layer LIRL. In FIG. 3, light being not converted is shown as a dotted line, and light being converted is shown as a solid line. In FIG. 3, the light A is outputted to the first color filter CF1 without being converted by the blue quantum dots BQD.

A light B is transmitted to the second color conversion pattern CCP2. The light B may be converted to a green light by the green quantum dots GQD. The green light may be outputted to the second color filter CF2 when it has a lower incidence angle than a threshold angle a2.

A light C is transmitted to the second color conversion pattern CCP2. The light C may be scattered by the scatterers SCT of the second color conversion pattern CCP2 and may impinge upon the low index of refraction layer LIRL with an incidence angle b1. The light C may be reflected by the low index of refraction layer LIRL and re-transmitted to the second color conversion pattern CCP2 since the incidence angle b1 of the light C is greater than the threshold angle a2 which is associated with the difference between the refractive index of the second color conversion pattern CCP2 and the refractive index of the low index of refraction layer LIRL. The light C may be reflected by the light reflection layer RFL when the light C is converted into a green light by the green quantum dots GQD. It is noted that the light reflection layer RFL reflects light that corresponds to a particular range of wavelengths lower than the blue light, such as a green light and a red light. The green light may be re-transmitted to the second color filter CF2 after it is reflected by the light reflection layer RFL.

According to the exemplary embodiment, the low index of refraction layer LIRL is disposed between the color conversion layers CCP1 to CCP3 and the color filters CF1 to CF3. Since a color conversion layer is not disposed directly on a corresponding color filter, light passing through the color conversion layer may not be absorbed by the color filter. Since light may be reflected by the low index of refraction layer LIRL and re-transmitted to a color conversion pattern, the probability of converting the light to desired color light may increase (refer to the light C). Thus, the amount of light being absorbed by a corresponding color filter decreases and the amount of light passing through the color filter increases. Accordingly, light emitted by the image generating device IMGD may be effectively and efficiently converted to desired light. Since the photoluminescence device PLD converts light effectively and efficiently, the display panel 100 may output a certain brightness of color light even if the image generating device IMGD emits a reduced brightness of light using a reduced power. Therefore, the display panel 100 having a luminous efficiency may be provided.

According to the exemplary embodiment, since the low index of refraction layer LIRL reflects or passes light according to an incidence angle of the light, the image generating device IMGD may employ visible light, such as the blue light, as well as ultraviolet rays and near-ultraviolet rays. In a case of which the image generating device IMGD emits visible light, such as the blue light, conversion loss when the visible light passes through the color conversion structure CCS may decrease. For example, the blue light emitted by the image generating device IMGD may not be absorbed by a blue color filter and be transmitted through the blue color filter although the blue light is not converted by blue quantum dots. Since the absorption of the visible light, such as the blue light is reduced, the display panel 100 may output a certain brightness of color light even if the image generating device IMGD emits a reduced brightness of light, such as blue light, using a reduced power. Therefore, the display panel 100 having a luminous efficiency may be provided.

FIG. 4 is a cross-sectional view of an exemplary embodiment of a display panel 100 taken along line I-I' of FIG. 1.

The image generating device IMGD shown in FIG. 1 may employ one of various known devices that provide light based on an input image signal. In an exemplary embodiment, the image generating device IMGD includes a light source to emit light and components to selectively pass the light based on the input image signal to output an image. In an exemplary embodiment, the image generating device IMGD includes light emitting layers and components to control the light emitting layers to selectively emit light. For instance, the image generating device IMGD may be at least one of a liquid crystal display device, an electrophoretic display device, an electrowetting display device, a microelectromechanical system (MEMS) device, and an organic light emitting diode (OLED) device, but the image generating device IMGD is not limited to the above-mentioned devices but may include any suitable device known in the art.

Referring to FIG. 4, an image generating device IMGD1 includes a backlight unit 11, a transparent substrate 12, first electrodes 13, a liquid crystal layer 14, a second electrode 15, and a polarizer 16.

The backlight unit 11 may include a light source to emit light and a light guide plate to guide the light to the transparent substrate 12, the first electrodes 13, the liquid crystal layer 14, and the second electrode 15. The light source may include at least one light emitting diode and be configured to emit the light, such as ultraviolet rays, near-ultraviolet rays, and visible light. The backlight unit 11 may further include a reflective plate that is disposed in a bottom portion of the backlight unit 11. The reflective plate may reflect the light to allow the light to travel to the liquid crystal layer 14.

The first electrodes 13, the liquid crystal layer 14, and the second electrode 15 are disposed on the transparent substrate 12. The liquid crystal layer 14 may be driven by an electromagnetic force caused by an electric field or an electric potential difference between the first electrodes 13 and the second electrode 15 to transmit the light provided from the backlight unit 11 to a color conversion unit. The electromagnetic forces between each of the first electrodes 13 and the second electrode 15 may control the liquid crystal layer 14 to transmit lights to each of the color conversion patterns CCP1 to CCP3.

The polarizer 16 is disposed on the second electrode 15 and transmits the light modulated to a given polarization direction by the liquid crystal layer 14. Since the polarization of the light passing through the liquid crystal layer 14 is maintained or turned by about 90 degrees depending on the electromagnetic force that is applied to the liquid crystal layer 14, the polarizer 16 may transmit light having a polarization direction perpendicular to the polarization direction of the light emitted from the backlight unit 11. The image generating device IMGD1 may further include another polarizer which is disposed on a bottom surface of the transparent substrate 12 and has a different polarization axis from that of the polarizer 16.

In the exemplary embodiments according to FIG. 4, the image generating device IMGD1 is a liquid crystal display device.

FIG. 5 is a cross-sectional view of another exemplary embodiment of a display panel 100 taken along line I-I' of FIG. 1.

Referring to FIG. 5, an image generating device IMGD2 includes a transparent substrate 21, first electrodes 22, light emitting layers 23, pixel defining layers 24, a second electrode 25, and an encapsulation layer 26.

The first electrodes 22, the light emitting layers 23, pixel defining layers 24, and the second electrode 25 are disposed on the transparent substrate 21. The pixel defining layer 24 may define areas in which the light emitting layers 23 are disposed. The light emitting layers 23 may be organic light emitting diodes OLEDs. The light emitting layers 23 are configured to emit lights according to a control of the first electrodes 22 and the second electrode 25. The lights emitted by the light emitting layers 23 may be transmitted to color conversion patterns CCP1 to CCP3, respectively.

The encapsulation layer 26 covers the transparent substrate 21, the first electrodes 22, the light emitting layers 23, the pixel defining layers 24, and the second electrode 25. The encapsulation layer 26 is configured to seal the transparent substrate 21, the first electrodes 22, the light emitting layers 23, the pixel defining layers 24, and the second electrode 25 to protect them from deterioration from moisture and oxygen permeated from the external environment.

In the exemplary embodiments according to FIG. 5, the image generating device IMGD2 is an OLED device.

FIGS. 6A, 6B, 6C, 6D, and 6E are cross-sectional views illustrating an exemplary method of manufacturing a photoluminescence device shown in FIG. 3.

Figure 6A:
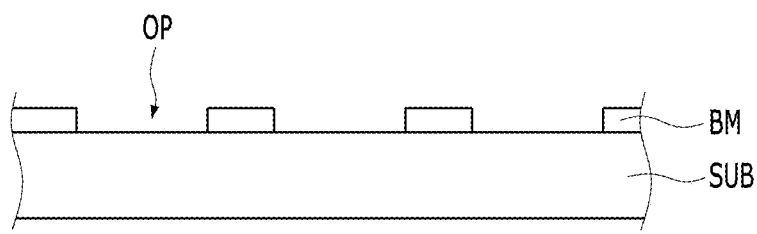
FIGS. 6A, 6B, 6C, 6D, and 6E are cross-sectional views illustrating an exemplary method of manufacturing the photoluminescence device shown in FIG. 3.
Figure 6B:
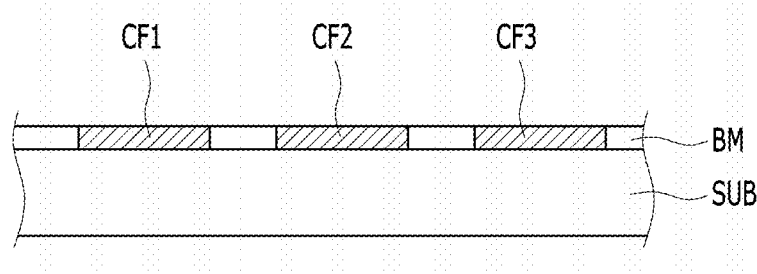

Referring to FIG. 6A, a black matrix BM is formed on a substrate. The substrate may be a transparent substrate such as a glass substrate. The black matrix BM has a plurality of openings that define display areas in a color conversion unit. Referring to FIG. 6B, first to third color filters CF1 to CF3 are disposed in the plurality of openings, respectively. The first to third color filters CF1 to CF3 may include a blue pigment, a green pigment, and a red pigment, respectively.

Figure 6C:
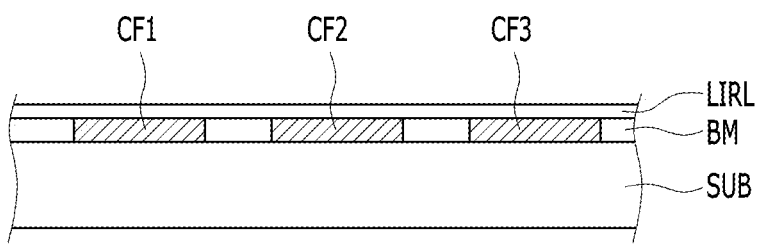

Referring to FIG. 6C, a low index of refraction layer LIRL is formed on the first to third color filters CF1, CF2, and CF3 and the black matrix BM. Materials of the low index of refraction layer LIRL may be selected to allow the low index of refraction layer LIRL to have a refractive index lower than that of color conversion patterns. The low index of refraction layer LIRL may include transparent resin and microcavities, and the refractive index of the low index of refraction layer LIRL may be adjusted by changing a number of microcavities per unit area.

Figure 6D:
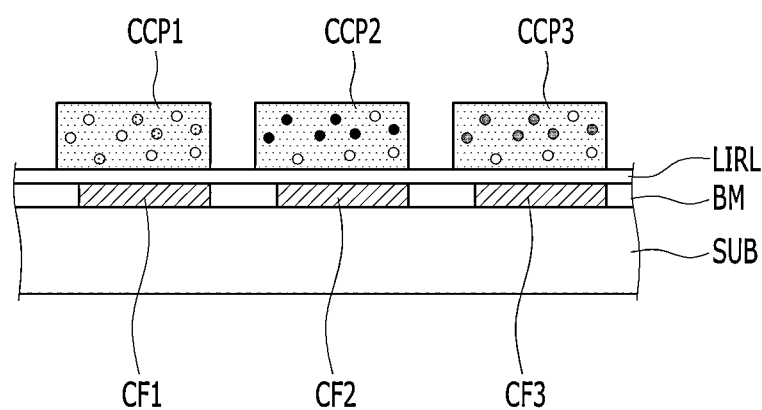

Referring to FIG. 6D, first to third color conversion patterns CCP1 to CCP3 are formed on the low index of refraction layer LIRL. The first to third color conversion patterns CCP1 to CCP3 may be formed in areas in which the first to third color filters CF1 to CF3 are positioned. The first to third color conversion patterns CCP1 to CCP3 may include a blue quantum dot, a green quantum dot, and a red quantum dot, respectively. The first to third color conversion patterns CCP1 to CCP3 may further include scatterers.

Figure 6E:
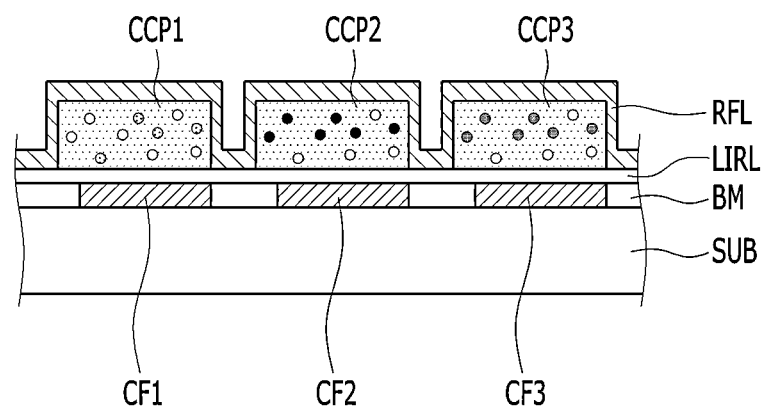

Referring to FIG. 6E, a light reflection layer RFL is formed on the first to third color conversion patterns CCP1 to CCP3. For instance, the light reflection layer RFL may be formed to cover at least one of side surfaces and/or top surfaces of the first to third color conversion patterns CCP1 to CCP3. The reflection layer RFL may include a first thin layer having a low index of refraction and a second thin layer having a high-refraction index, which layers are alternatively stacked. In an exemplary embodiment, the first and second thin layers may include silicon compounds, silicon nitride SiN, silicon oxynitride SiON, and silicon oxide SiO. After that, the overcoat layer OCL shown in FIG. 3 may be formed on the light reflection layer RFL.

FIG. 7 is a cross-sectional view of an exemplary embodiment of a photoluminescence device PLD of the invention.

Referring to FIG. 7, the photoluminescence device PLD includes an overcoat layer OCL, first and second low index of refraction layers LIRL1 and LIRL2, first to third color conversion patterns CCP1 to CCP3, first to third color filters CF1 to CF3, a black matrix BM, and a substrate SUB.

The overcoat layer OCL, the first to third color conversion patterns CCP1 to CCP3, the first to third color filters CF1 to CF3, the black matrix BM, and the substrate SUB may be configured in a similar manner to the overcoat layer OCL, the first to third color conversion patterns CCP1 to CCP3, the first to third color filters CF1 to CF3, the black matrix BM, and the substrate SUB described with reference to FIGS. 2 and 3, respectively. Hereinafter, descriptions of like components are unnecessary and will be omitted for clarity and conciseness.

The first low index of refraction layer LIRL1 is disposed between the color conversion patterns CCP1 to CCP3 and the color filters CF1 to CF3. The second low index of refraction layer LIRL2 is disposed between the color conversion patterns CCP1 to CCP3 and the overcoat layer OCL. In an exemplary embodiment, the second low index of refraction layer LIRL2 may cover all of surfaces of the color conversion patterns CCP1 to CCP3 except the surfaces contacting with the first low index of refraction layer LIRL1, so the sides and bottom of the CCPs shown in FIG. 7.

The second low index of refraction layer LIRL2 may have the same materials as the first low index of refraction layer LIRL1. The second low index of refraction layer LIRL2 may have the same refractive index as the first low index of refraction layer LIRL1. That is, the low index of refraction layer including the first and second low index of refraction layers LIRL1 and LIRL2 surrounds the color conversion patterns CCP1 to CCP3. In an exemplary embodiment, each of the first and second low index of refraction layers LIRL1 and LIRL2 is a single layer including transparent resin and microcavities.

For descriptive convenience, it is assumed that the image generating device IMGD shown in FIG. 1 provides blue light in conjunction with the PLD of FIG. 7. In FIG. 7, light being not converted is shown as a dotted line, and light being converted is shown as a solid line.

The light E is transmitted to the first color conversion pattern CCP1. A direction of the light E may be changed when the light E is scattered by the scatterers SCT of the first color conversion pattern CCP1. The light E may be transmitted to the first color filter CF1 when an incidence angle of the light E is less than a threshold angle which is associated with the difference between the refractive index of the first low index of refraction layer LIRL1 and the refractive index of the first color conversion pattern CCP1.

The light F is transmitted to the first color conversion pattern CCP1. A direction of the light F may be changed by the scatterers SCT of the first color conversion pattern CCP1. The light F may be reflected by the first low index of refraction layer LIRL1 when an incidence angle of the light F is greater than the threshold angle, which may be about 50 degrees. The light F may be also reflected by the second low index of refraction layer LIRL2 when an incidence angle of the light F impinging the second low index of refraction layer LIRL2 is greater than a threshold angle which is associated with the difference between the refractive index of the second low index of refraction layer LIRL2 and the refractive index of the first color conversion pattern CCP1.

In FIG. 7, the light F is transmitted to the first color filter CF1 after the light F is reflected by the second low index of refraction layer LIRL2.

The light G is transmitted to the second color conversion pattern CCP2. The light G, which impinges the first low index of refraction layer LIRL1, may be reflected by the first low index of refraction layer LIRL1 when an incidence angle of the light G is greater than a threshold angle. The light G may be converted into a green light by green quantum dots GQD after the light G is re-provided to the second color conversion pattern CCP2. After that, the light G may be transmitted to the second color filter CF2 after the light G is reflected by the second low index of refraction layer LIRL2 as shown in FIG. 7.

The light H is transmitted to the third color conversion pattern CCP3. The light H may be reflected be the first low index of refraction layer LIRL1 when an incidence angle of the light H is greater than a threshold angle. The reflected light H may be re-transmitted to the third color conversion pattern CCP3. The light H may be reflected by the second low index of refraction layer LIRL2 when the light H has a lower incidence angle than a threshold angle, although the light H do not meet red quantum dots RQD and still has a wavelength of the blue light. That is, the light H may be re-transmitted. The light H may be converted into a red light by red quantum dots and transmitted to the third color filters CF3.

According to the exemplary embodiment, the second low index of refraction layer LIRL2 is disposed below the color conversion patterns CCP1 to CCP3. Even though light, which is reflected by the first low index of refraction layer LIRL1, is not converted by quantum dots until the light impinges the second low index of refraction layer LIRL2, the light may be reflected by the second low index of refraction layer LIRL2 and re-provided to a color conversion pattern. The probability of converting the light may increase. Accordingly, light emitted by the image generating device IMGD may be effectively and efficiently converted to desired light.

Figure 8:
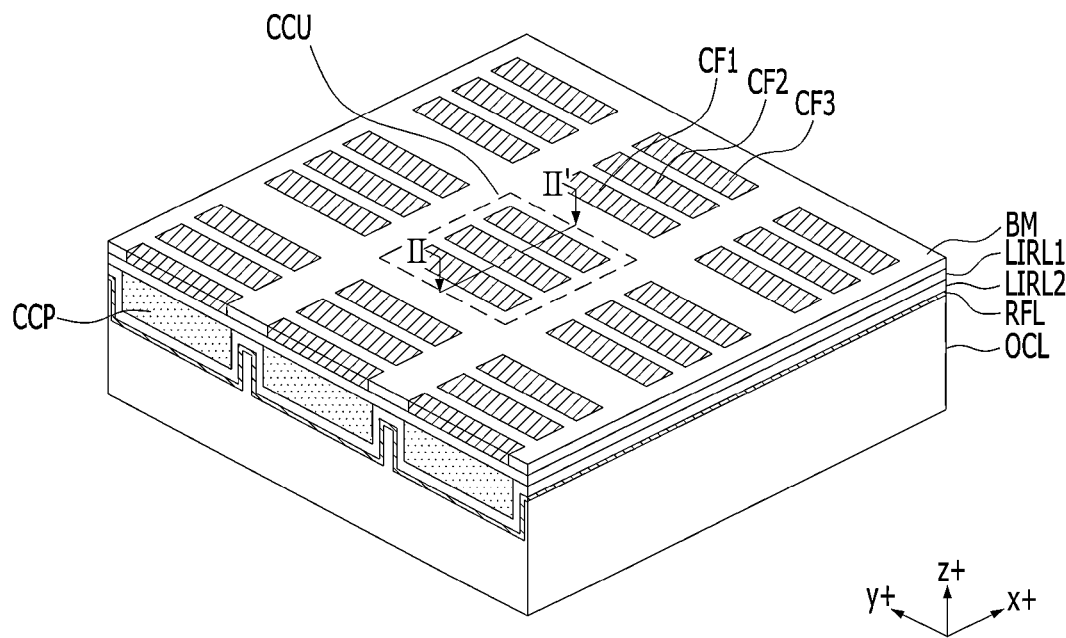
FIG. 8 is a perspective view illustrating a portion of the color conversion structure CCS shown in FIG. 1 according to another exemplary embodiment of the invention.
Figure 9:
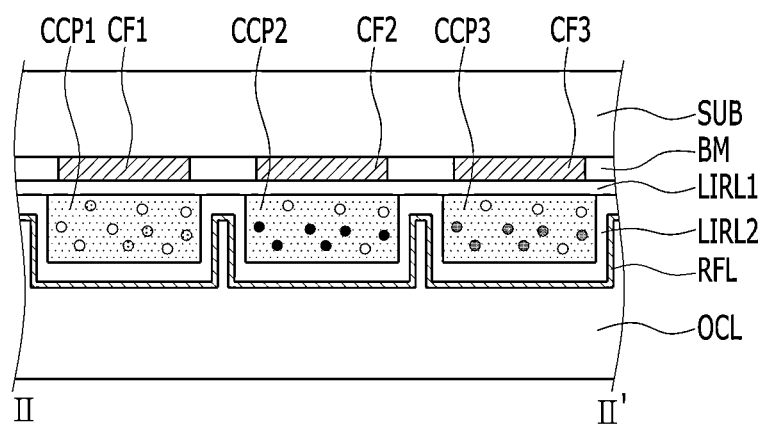
FIG. 9 is a cross-sectional view of an exemplary embodiment of a photoluminescence device taken along line II-II' of FIG. 8.

FIG. 8 is a perspective view illustrating a portion of the color conversion structure CCS shown in FIG. 1 according to another exemplary embodiment of the invention. FIG. 9 is a cross-sectional view of an exemplary embodiment of a photoluminescence device PLD taken along line II-II' of FIG. 8.

Referring to FIGS. 8 and 9, the color conversion structure CCS includes an overcoat layer OCL, a light reflection layer RFL, first and second low index of refraction layer LIRL1 and LIRL2, color conversion patterns CCP, a black matrix BM, and color filters CF1, CF2, and CF3. A color conversion unit includes first to third color conversion patterns CCP1 to CCP3 which correspond to the first to third color filters CF1 to CF3, respectively.

The second low index of refraction layer LIRL2 covers surfaces of the color conversion patterns CCP except their surfaces which contact the first low index of refraction layer LIRL1. That is, the low index of refraction layer including the first and second low index of refraction layers LIRL1 and LIRL2 may surround the color conversion patterns CCP.

The light reflection layer RFL is further disposed between the second low index of refraction layer LIRL2 and the overcoat layer OCL. The light reflection layer RFL may cover the second low index of refraction layer LIRL2.

The second low index of refraction layer LIRL2 may reflect light having an incidence angle greater than a threshold angle as described with reference to FIG. 7. The light reflection layer RFL may reflect light having a range of wavelengths lower than the light transmitted from the image generating device IMGD as described with reference with FIG. 3. Accordingly, light emitted by the image generating device IMGD may be effectively and efficiently converted to desired light.

In an exemplary embodiment, the stacking sequence for the second low index of refraction layer LIRL2 and the light reflection layer RFL may be changed. For example, the light reflection layer RFL may be disposed between the color conversion patterns CCP and the second low index of refraction layer LIRL2, and cover the color conversion patterns CCP. In this case, the second low index of refraction layer LIRL2 may cover the light reflection layer RFL.

Figure 10:
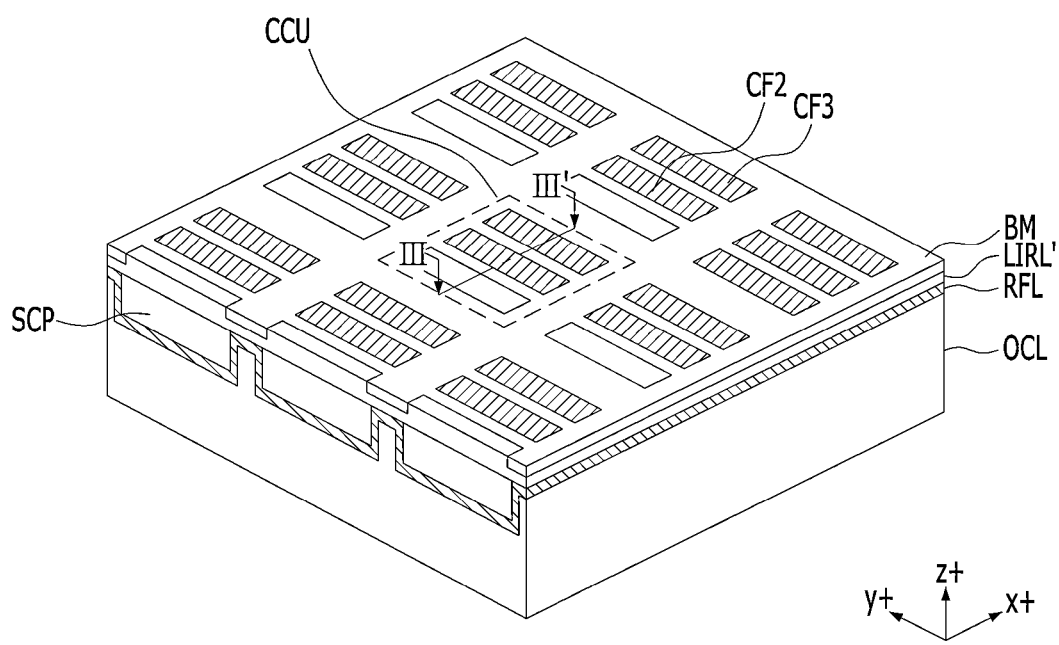
FIG. 10 is a perspective view illustrating a portion of the color conversion structure CCS shown in FIG. 1 according to another exemplary embodiment of the invention.
Figure 11:
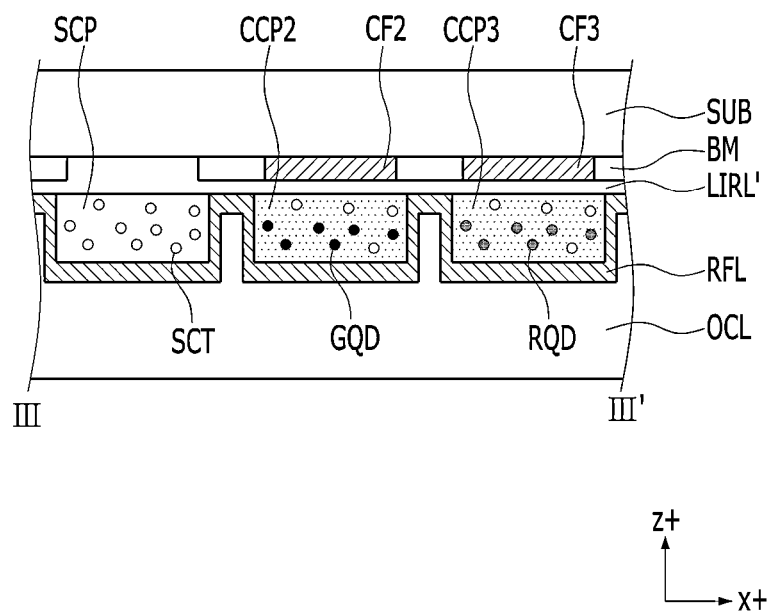
FIG. 11 is a cross-sectional view of the photoluminescence device taken along line III-III' of FIG. 10.

FIG. 10 is a perspective view illustrating a portion of the color conversion structure CCS shown in FIG. 1 according to an exemplary embodiment of the invention. FIG. 11 is a cross-sectional view of an exemplary embodiment of a photoluminescence device PLD taken along line III-III' of FIG. 10.

Referring to FIGS. 10 and 11, the color conversion structure CCS includes an overcoat layer OCL, a light reflection layer RFL, a scattering pattern SCP, second and third color conversion patterns CCP2 and CCP3, a low index of refraction layer LIRL', a black matrix BM, and second and third color filters CF2 and CF3. A color conversion unit includes second and third color conversion patterns CCP2 and CCP3 which correspond to the second and third color filters CF2 and CF3, respectively.

The scattering pattern SCP may be substituted for one of the first to third color conversion patterns CCP1 to CCP3 described with reference to FIG. 2 when the image generating device IMGD shown in FIG. 1 emits visible light. The scattering pattern SCP includes scatterers but excludes quantum dots. In FIGS. 10 and 11, the scattering pattern SCP is substituted for the first color conversion pattern CCP1. The second color conversion pattern CCP2 may include green quantum dots GQD and the third color conversion pattern CCP3 may include red quantum dots RQD. In this case, the image generating device IMGD may emit a blue light having an intensity associated with the grayscale of the blue light.

At least one color filter may be provided in each of the color conversion units CCU. For example, the first color filter CF1 described with reference to FIG. 2 may be omitted, and two color filters CF2 and CF3 may be provided in each of the color conversion units CCU. Light scattered by the scattering pattern SCP may be transmitted to the substrate SUB without being filtered by a color filter. A display area, which is defined by the black matrix BM and corresponds to the scattering pattern SCP, may be filled with the low index of refraction layer LIRL'. The low index of refraction layer LIRL' may have a first thickness in the display area corresponding to the scattering pattern SCP and have a second thickness in remaining areas, the first thickness being thicker than the second thickness. Light which is converted by the second and third color conversion patterns CCP2 and CCP3 may be transmitted via the second and third color filters CF2 and CF3, respectively.

In an exemplary embodiment, the scattering pattern SCP may further include blue pigments in a case of which the first color filter CF is omitted.

Figure 12:
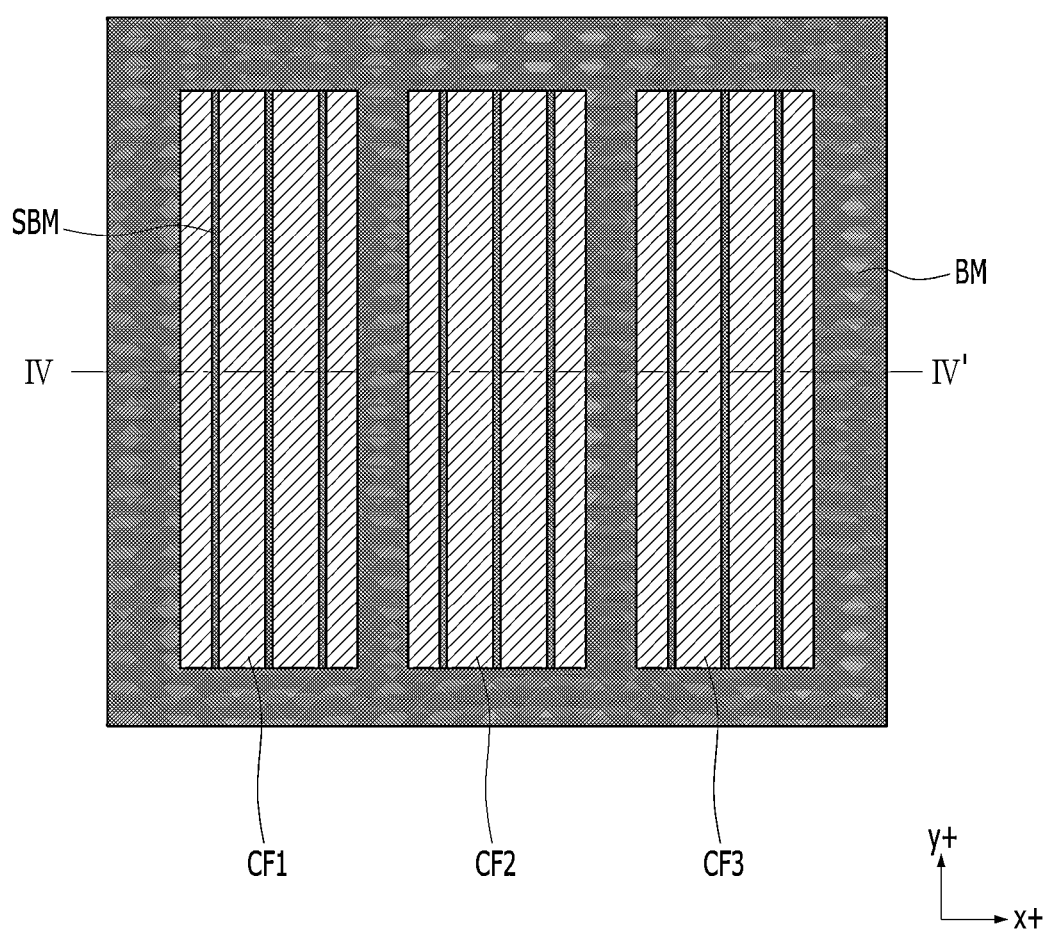
FIG. 12 is a plan view of an exemplary embodiment of a color conversion unit.

FIG. 12 is a plan view of an exemplary embodiment of a color conversion unit.

Referring to FIG. 12, each of the color conversion units CCU includes first to third color filters CF1 to CF3, a black matrix BM, and sub-black matrices SBM. The black matrix BM and the sub-black matrices SBM are emphasized with black patterns for perception convenience.

The sub-black matrices SBM are disposed in display areas in which the first to third color filters CF1 to CF3 are disposed. Each of the sub-black matrices SBM extends in a first direction x. That is, each of the color conversion units CCU may include stripe-shaped sub-black matrices SBM.

Figure 13:
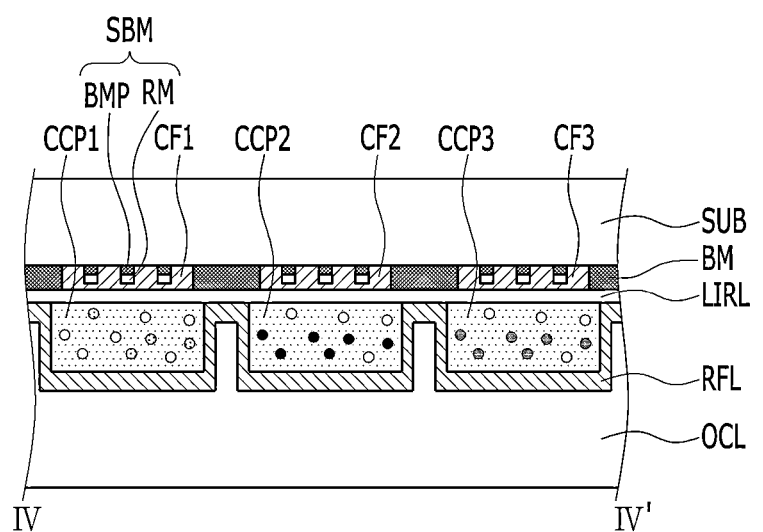
FIG. 13 is a cross-sectional view of the color conversion unit taken along line IV-IV'.

FIG. 13 is a cross-sectional view of the color conversion unit taken along line IV-IV'.

Referring to FIG. 13, a photoluminescence device PLD includes an overcoat layer OCL, a light reflection layer RFL, first to third color conversion patterns CCP1 to CCP3, a low index of refraction layer LIRL, first to third color filters CF1 to CF3, a black matrix BM, a sub-black matrices SBM, and a substrate SUB.

The overcoat layer OCL, the light reflection layer RFL, the first to third color conversion patterns CCP1 to CCP3, the low index of refraction layer LIRL, the first to third color filters CF1 to CF3, the black matrix BM, and the substrate SUB may be configured in a similar manner to those of the photoluminescence device PLD described with reference to FIGS. 2 and 3. Hereinafter, overlapping descriptions will be omitted.

The sub-black matrices SBM are disposed on the substrate SUB. The sub-black matrices SBM may be formed on the substrate SUB when the black matrix BM is formed. Each of the sub-black matrices SBM may includes a reflection metal pattern RM facing the low index of refraction layer LIRL and a sub-black matrix pattern BMP disposed between the reflection metal pattern RM and the substrate.

The sub-black matrix pattern BMP may absorb light from an external so as to decrease the external light reflection. For instance, the sub-black matrix includes at least one of titanium (Ti), indium zinc oxide (IZO), silver (Ag), and aluminum (Al).

The reflection metal pattern RM may reflect light passing through a corresponding color conversion pattern and the low index of refraction layer LIRL so that the light is re-provided to the color conversion pattern. The color conversion pattern may convert the light into a corresponding color light. Accordingly, the reflection metal pattern RM may increase the probability of converting the light.

Figure 14:
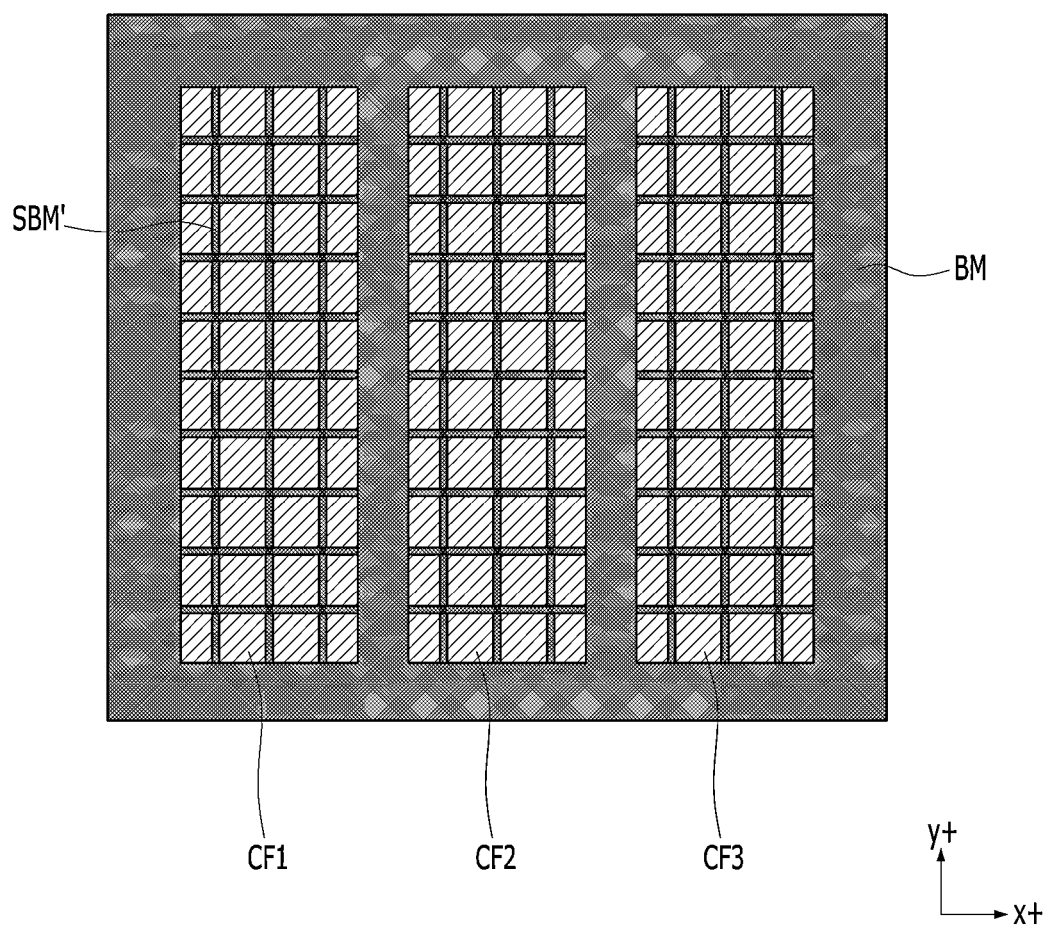
FIG. 14 is a plan view of another exemplary embodiment of a color conversion unit.

FIG. 14 is a plan view of another exemplary embodiment of a color conversion unit.

Referring to FIG. 14, each of the color conversion units CCU includes first to third color filters CF1 to CF3, a black matrix BM, and sub-black matrices SBM'.

The sub-black matrices SBM' may have one of various shapes. The sub-black matrices SBM' are disposed in display areas in which the first to third color filters CF1 to CF3 are disposed. Each of the sub-black matrices SBM' extends in a first direction x or in a second direction y. That is each of the color conversion units CCU may include mesh-shaped sub-black matrices SBM. Each of the sub-black matrices SBM' may include a reflection metal pattern RM and a sub-black matrix pattern BMP as described with reference to FIG. 13.

Figure 15:
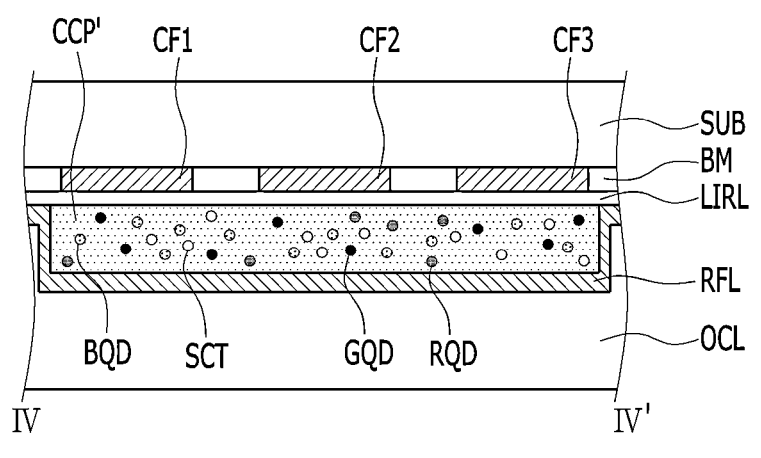
FIG. 15 is a cross-sectional view of another exemplary embodiment of a photoluminescence device PLD taken along line I-I' of FIG. 1.

FIG. 15 is a cross-sectional view of another exemplary embodiment of a photoluminescence device PLD taken along line I-I' of FIG. 1.

Referring to FIG. 15, a color conversion unit may include at least one color conversion pattern CCP' which is disposed between a low index of refraction layer LIRL and a light reflection layer RFL. In FIG. 15, a single color conversion pattern CCP' is provided in the color conversion unit. The first to third color conversion patterns CCP1 to CCP3 shown in FIG. 3 may be integrated into the color conversion pattern CCP'. The color conversion pattern CCP' includes scatterers SCT, blue quantum dots BQD, green quantum dots GQD, and red quantum dots RQD. The first color filter CF1 may selectively pass light of a range of wavelengths corresponding to blue. The second color filter CF2 may selectively pass light of a range of wavelengths corresponding to green. The third color filter CF3 may selectively pass light of a range of wavelengths corresponding to red.

In another exemplary embodiment, the second and third color conversion patterns CCP2 and CCP3 may be integrated into a single color conversion pattern.

The manufacturing cost may decrease in the case where at least two of the first to third color conversion patterns CCP1 to CCP3 are integrated into the single color conversion pattern CCP' as shown in FIG. 15.

Figure 16:
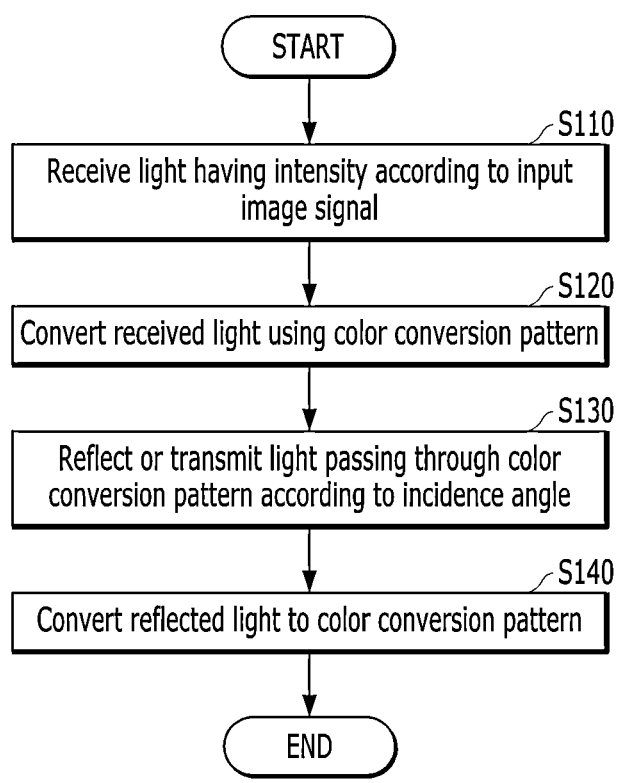
FIG. 16 is a flowchart illustrating an exemplary method of controlling a photoluminescence device according to an exemplary embodiment.

FIG. 16 is a flowchart illustrating an exemplary method of controlling a photoluminescence device according to an exemplary embodiment.

Referring to FIG. 16, at step S110, light having an intensity according to an input image signal is received. The intensity may be associated with grayscale of the light, such as ultraviolet rays, near-ultraviolet rays, and visible light including blue light. At step S120, the received light is converted from one wavelength to another using a color conversion pattern. The color conversion pattern may include a color conversion material such as phosphor and quantum dots. The color conversion material may absorb the light and emit light having a different wavelength. Some lights may be converted, but the other lights may not be converted while passing through the color conversion pattern.

At step S130, light passing through the color conversion pattern is reflected or transmitted to a color filter according to an incidence angle of the light. The incidence angle of the light may be an angle between a direction of the light and an orthogonal direction to a surface of the color conversion pattern. The surface of the color conversion pattern may be a boundary of the color conversion pattern and a low index of refraction layer. A layer having a low index of refraction layer may be disposed on the color conversion pattern. The low index of refraction layer may have a refractive index lower than the color conversion pattern. The light passing through the color conversion pattern may be reflected when the incidence angle is equal to or greater than a threshold angle. The light passing through the color conversion pattern may be transmitted to a color filter when the incidence angle is less than the threshold angle.

At step S140, the reflected light is converted using the color conversion pattern and transmitted to an external through some elements, such as a color filter and glass.

According to the exemplary embodiments, light passing through the color conversion layer is re-transmitted to the color conversion layer. The probability of converting the light to desired color light may increase. Accordingly, an amount of light being absorbed by a corresponding color filter decreases and an amount of light passing through the color filter increases. Accordingly, light emitted by the image generating device IMGD may be effectively and efficiently converted to desired light and the luminous efficiency increased.

Figure 17:
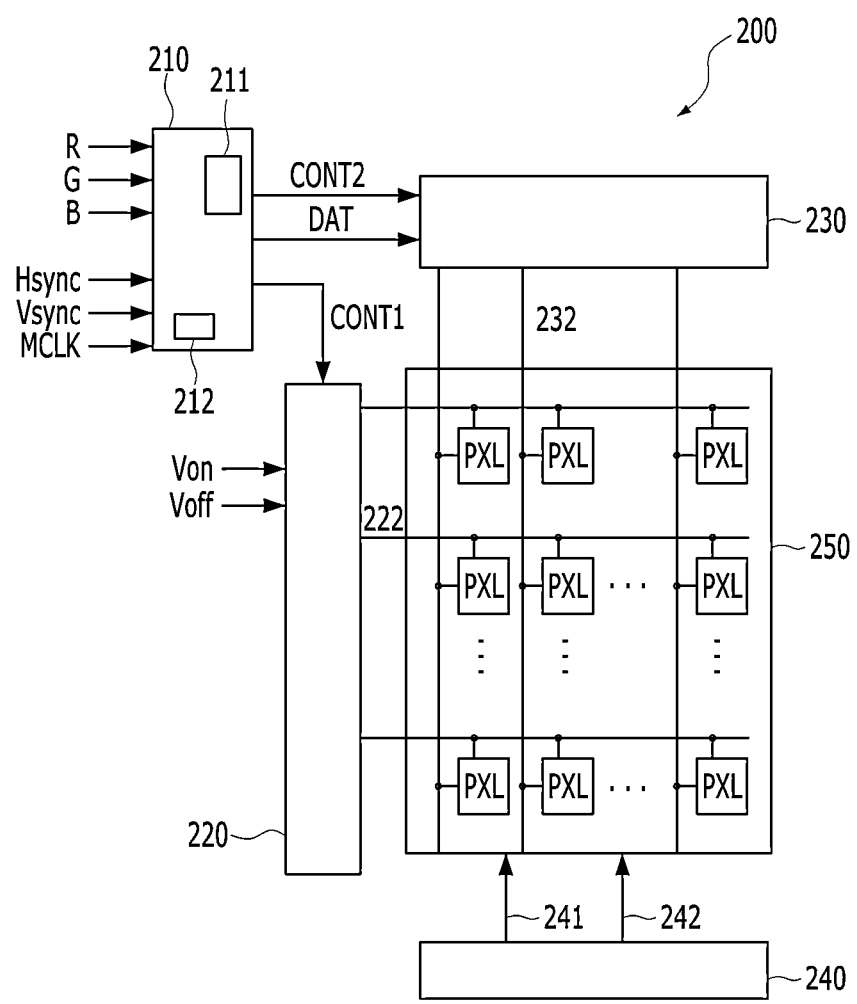
FIG. 17 is a block diagram illustrating a image generating device IMGD according to an exemplary embodiment.

FIG. 17 is a block diagram illustrating a image generating device IMGD according to an exemplary embodiment.

Referring to FIG. 17, the image generating device IMGD may include a signal controller 210, a gate driver 220, a data driver 230, and a pixel block 250.

The signal controller 210 receives an input image signal RGB (e.g., video signals) provided by an external and an input control signal for controlling the input image signal RGB. The input image signal RGB may include luminance information for each of pixels PXL and the luminance information may have a selected number of grayscale values. The input control signal may include a vertical synchronization signal Vsync, a horizontal synchronization signal Hsync, and a main clock signal MCLK.

The signal controller 210 includes a processor 211 and a memory 212. The signal controller 210 generates a scan control signal CONT1, a data control signal CONT2, and an image data signal DAT based on the input image signal RGB and the input control signal. The signal controller 210 may transfer the scan control signal CONT1 to the gate driver 220 based on the input image signal RGB and the image control signal. The signal controller 210 may transfer the data control signal CONT2 and the image data signal DAT to the data driver 230.

The gate driver 220 is connected to the plurality of scan lines 222 and applies the scan signal, the combination of a gate-on voltage Von and a gate-off voltage Voff to the plurality of scan lines 222 according to the scan control signal CONT1. The gate driver 220 may sequentially apply a scan signal with the gate on voltage Von to the plurality of scan lines 222.

The data driver 230 is connected to the pixel block 250 through a plurality of data lines 232. The data driver 230 may control the application of a data voltage to the plurality of data lines 232 according to the data control signal CONT2 and the image data signal DAT. The data driver 230 may select the data voltage according to the grayscale value of the image data signal DAT. The data driver 230 may apply the data voltage to the pixel block 250 according to the data control signal CONT2. When the gate driver 220 sequentially applies the scan signal with the gate on voltage Von to the plurality of scan lines 222, the data driver 230 may apply the data voltage via the data lines 232 for the pixels PXL corresponding to the scan line to which the gate on voltage Von is applied.

The power supply 240 supplies at least one of voltages to the pixel block 250. The power supply 240 may supply a first power source voltage 241 and a second power source voltage 242 to the pixel block 250. For example, the first power source voltage 241 is positive voltage and the second power source voltage 242 is negative voltage or vice versa.

The pixel block 250 includes a plurality of pixels PXL. The pixels PXL may be arranged in the first direction x and the second direction as shown in FIG. 1. For example, plurality of pixels PXL may be disposed in a matrix format. The pixels PXL may face the photoluminescence device PLD shown in FIG. 1. Each of the pixels PXL may correspond to color conversion units CCU shown in FIG. 1. For example, the pixels PXL may be aligned to transmit light to the color conversion units CCU. The pixels PXL may transmit the light having a certain intensity associated with grayscale of the light to the photoluminescence device PLD. The intensity of the light may be controlled by the signal controller 210, the gate driver 220, the data driver 230, and the power supply 240 based on the input image signal RGB.

Each of the plurality of pixels may include a set of subpixels (not illustrated). The set of subpixels may include a first subpixel, a second subpixel, and a third subpixel. For example, the first to third subpixels may correspond to the liquid crystal layer 14 which is controlled by the first electrodes and the second electrode shown in FIG. 4. For another example, the first to third subpixels may correspond to the light emitting layers 23 which are controlled by the first electrodes 22 and the second electrode 25 shown in FIG. 5. The set of subpixels may further include a number of subpixels greater than three subpixels.

In an exemplary embodiment, the signal controller 210, the gate driver 220, the data driver 230, the power supply 240, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the signal controller 210, the gate driver 220, the data driver 230, the power supply 240, and/or one or more components thereof may include or otherwise be associated with one or more memories (not shown) including code (e.g., instructions) configured to cause the signal controller 210, the gate driver 220, the data driver 230, the power supply 240, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

In an exemplary embodiment, the signal controller 210, the gate driver 220, the data driver 230, and the power supply 240 may be disposed in the non-display area of the image generating device IMGD and/or on the back side of the image generating device IMGD.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display panel including a main area, and an peripheral area surrounding the main area and defining an edge, the display panel comprising:
   a light emitting device to generate light; and
   a photoluminescence device disposed on the light emitting device, and the photoluminescence device comprising:
   a plurality of color conversion patterns disposing corresponding to the main area:
   a first index of refraction layer disposed on an upper surface of the plurality of color conversion patterns; and
   a second index of refraction layer disposed under the plurality of color conversion patterns, and the second index of refraction layer has a refractive index lower than a refractive indexes of the plurality of color conversion patterns, and
   wherein the plurality of color conversion patterns comprises:
   a first color conversion pattern including first quantum dots to convert the light of the light emitting device to have a first wavelength; and
   a second color conversion pattern including second quantum dots to convert the light to have a second wavelength; and wherein the first index of refraction layer and the second index of refraction layer contact each other at the peripheral area.

2. The display panel of claim 1, wherein the first index of refraction layer has a refractive index lower than refractive indexes of the first and second color conversion patterns.

3. The display panel of claim 2, wherein the first index of refraction layer is configured to reflect light passing through the first and second color conversion patterns according to an incident angle.

4. The display panel of claim 1, wherein the photoluminescence device further comprising a plurality of color filters disposed on plurality of color conversion patterns, the plurality of color filters comprising:
   a first color filter overlapping the first color conversion pattern; and
   a second color filter overlapping the second color conversion pattern;
   wherein the first color filter is configured to selectively pass light of a first range of wavelengths transmitted through the first color conversion pattern, and the second color filter is configured to selectively pass light of a second range of wavelengths transmitted through the first color conversion pattern, and
   wherein the first range and the second range are different from each other.

5. The display panel of claim 4, wherein the plurality of color filters are arranged in a surface direction of the display panel, and the first index of refraction layer continuously extends in the surface direction to overlap the first and the second color conversion patterns.

6. The display panel of claim 1, wherein
   the second wavelength is different from the first wavelength.

7. The display panel of claim 4, wherein the refractive index of the first index of refraction layer is lower than a refractive index of the plurality of color filters.

8. The display panel of claim 1, further comprising a light reflection layer disposed between the plurality of color conversion patterns and the light emitting device.

9. The display panel of claim 8, wherein the light reflection layer is configured to selectively reflect light of a particular range of wavelengths.

10. The display panel of claim 8, wherein the light reflection layer covers the plurality of color conversion patterns.

11. The display panel of claim 8, wherein the second index of refraction layer is disposed between the plurality of color conversion patterns and the light reflection layer.

12. The display panel of claim 1, wherein the first index of refraction layer comprises transparent resin and microcavities.

13. The display panel of claim 1, wherein the light emitting device comprises:
a substrate;
first electrodes disposed on the substrate;
a pixel defining layer to define a plurality of pixel areas;
a second electrode overlapping the first electrodes; and
a plurality of light emitting layers are disposed between the first electrodes and the second electrode in the pixel areas.

14. The display panel of claim 13, wherein the light emitting device further comprises an encapsulation layer to cover the first electrodes, the pixel defining layer, the light emitting layers, and the second electrode.

15. The display panel of claim 1, further comprising an overcoat layer disposed between the light emitting device and the plurality of color conversion patterns.

16. The display panel of claim 1, wherein the first low index of refraction layer directly contacts the first color conversion pattern and the second color conversion pattern.

17. The display panel of claim 1, wherein the first index of refraction layer and the second index of refraction layer are spaced apart from each other with the color conversion patterns in therebetween, in the main area.

18. A display panel including a main area, and an peripheral area surrounding the main area and defining an edge, the display panel comprising:
a light emitting device to generate light;
a plurality of color conversion patterns disposed on the light emitting device, the plurality of color conversion patterns spaced apart from each other and arranged in a surface direction of the display panel;
a plurality of color filters disposed on the plurality of color conversion patterns;
an overcoat layer under the plurality of color conversion patterns;
a first index of refraction layer disposed between the plurality of color conversion patterns and the plurality of color filters; and
a second index of refraction layer disposed between the plurality of color conversion patterns and the overcoat layer,
wherein the first index of refraction layer and the second index of refraction layer contact each other at the peripheral area,
wherein the second index of refraction layer has a refractive index lower than refractive indexes of the first and second color conversion patterns, and
wherein the overcoat layer consist of at least one of an organic material and an inorganic material.

19. The display panel of claim 1, wherein the refractive index of the first index of refraction layer is lower than a refractive index of the plurality of color filters.

20. The display panel of claim 13, wherein the plurality of light emitting layers arranged in a surface direction of the display panel to emit light based on an input image signal.

21. The display panel of claim 13, wherein the plurality of light emitting layers comprise organic light emitting diodes.

22. The display panel of claim 13, wherein the plurality of pixel areas and the plurality of color conversion patterns are disposed corresponding to the main area, and the plurality of pixel areas and the plurality of color conversion patterns are not disposed in the peripheral area.

* * * * *